United States Patent [19]

Burns et al.

[11] Patent Number: 5,369,058
[45] Date of Patent: Nov. 29, 1994

[54] WARP-RESISTENT ULTRA-THIN INTEGRATED CIRCUIT PACKAGE FABRICATION METHOD

[75] Inventors: Carmen D. Burns; James W. Cady; Jerry M. Roane, all of Austin; Philip R. Troetschel, Buda, all of Tex.

[73] Assignee: Staktek Corporation, Austin, Tex.

[21] Appl. No.: 206,304

[22] Filed: Mar. 4, 1994

Related U.S. Application Data

[63] Continuation-in-part of Ser. No. 37,830, Mar. 29, 1993.

[51] Int. Cl.$^5$ ............................................. H01L 21/60
[52] U.S. Cl. .................................... 437/209; 437/211; 437/214; 437/215; 437/217; 437/219
[58] Field of Search ............... 437/209, 211, 212, 213, 437/214, 215, 217, 219, 220; 257/730, 683, 684, 787, 788

[56] References Cited

U.S. PATENT DOCUMENTS

| | | | |
|---|---|---|---|
| 2,241,493 | 12/1960 | Andrulits et al. | 437/209 X |
| 3,436,604 | 4/1966 | Hyltin et al. | 317/101 |
| 3,614,546 | 10/1971 | Avins | 317/234 R |
| 3,713,893 | 1/1973 | Shirland | 437/205 X |
| 3,739,462 | 6/1973 | Hasty | 29/577 |
| 4,103,318 | 7/1978 | Schwede | 361/388 |
| 4,158,745 | 6/1979 | Keller | 174/52 FP |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tatano et al. | 29/588 |
| 4,521,828 | 6/1985 | Fanning | 361/386 |
| 4,525,921 | 7/1985 | Carson et al. | 29/577 |
| 4,530,152 | 7/1985 | Roche et al. | 29/588 |
| 4,630,172 | 12/1986 | Stenerson et al. | 361/386 |

(List continued on next page.)

FOREIGN PATENT DOCUMENTS

| | | |
|---|---|---|
| 57-31166 | 2/1982 | Japan . |
| 58-96756A | 6/1983 | Japan . |
| 58-112348 | 7/1983 | Japan . |
| 61-163652A | 1/1985 | Japan . |
| 60-180150A | 9/1985 | Japan . |
| 63-153849 | 6/1988 | Japan . |
| 63-53959 | 8/1988 | Japan . |

OTHER PUBLICATIONS

Information allegedly written by Emory Garth regarding "Memory Stacks", Applicant received a facsimile from Emory Garth on Jan. 26, 1993. (Publication date unknown).

(List continued on next page.)

Primary Examiner—Brian E. Hearn
Assistant Examiner—Kevin M. Picardat
Attorney, Agent, or Firm—Fulbright & Jaworski

[57] ABSTRACT

The present invention provides a method for fabricating modified integrated circuit packages that are ultra-thin and resist warping. The integrated circuit packages are made thinner by removing some of the casing material uniformly from the upper and lower major surfaces of the integrated circuit package. To prevent the resulting ultra-thin integrated circuit package from warping, a thin layer of material with a coefficient of thermal expansion less than that of silicon is mounted to the upper major surface of the package after some of the casing material has been removed uniformly from the upper major surface. Also, a thin layer of material with a coefficient of thermal expansion greater than that of silicon may be mounted to the lower major surface of the package after some of the casing material has been removed uniformly from the lower major surface and after a layer of adhesive has been applied to the thin layer of material and cured. The result is an ultra-thin integrated circuit package that is thermally and mechanically balanced to prevent warping.

18 Claims, 5 Drawing Sheets

U.S. PATENT DOCUMENTS

| | | | |
|---|---|---|---|
| 4,633,573 | 1/1987 | Scherer | 29/589 |
| 4,680,617 | 7/1987 | Ross | 357/72 |
| 4,684,975 | 8/1987 | Takiar et al. | 357/70 |
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,796,078 | 1/1989 | Phelps, Jr. et al. | 357/68 |
| 4,821,148 | 4/1989 | Kobayashi et al. | 361/392 |
| 4,823,234 | 4/1989 | Konishi et al. | 361/386 |
| 4,829,403 | 5/1989 | Harding | 361/386 |
| 4,833,568 | 5/1989 | Berhold | 361/383 |
| 4,839,717 | 6/1989 | Phy et al. | 357/74 |
| 4,855,868 | 8/1989 | Harding | 361/386 |
| 4,862,245 | 8/1989 | Pashby et al. | 357/70 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 357/80 |
| 5,065,277 | 11/1991 | Davidson | 361/383 |
| 5,086,018 | 2/1992 | Conru et al. | 437/237 |
| 5,089,876 | 2/1992 | Ishioka | 357/70 |
| 5,099,393 | 3/1992 | Bentlage et al. | 361/413 |
| 5,108,553 | 4/1992 | Foster et al. | 29/852 |
| 5,138,430 | 8/1992 | Gow, 3rd. et al. | 357/70 |
| 5,138,434 | 8/1992 | Wood et al. | 357/74 |
| 5,139,430 | 8/1992 | Mori | 437/183 |
| 5,147,822 | 9/1992 | Yamazaki et al. | 437/215 |
| 5,151,559 | 9/1992 | Conru et al. | 174/52.4 |
| 5,155,063 | 10/1992 | Tada | 437/211 |
| 5,214,845 | 6/1993 | King et al. | 29/841 |
| 5,223,739 | 6/1993 | Katsumata et al. | 257/676 |

OTHER PUBLICATIONS

Catalog of Dense-Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870. (Publication date unknown).

WARP-RESISTENT ULTRA-THIN INTEGRATED CIRCUIT PACKAGE FABRICATION METHOD

SPECIFICATION

This application is a continuation-in-part of application Ser. No. 08/037,830, filed Mar. 29, 1993, pending, which is incorporated herein for all purposes.

BACKGROUND OF THE INVENTION

1. Field of the Invention

This invention relates to a method for fabricating warp-resistant ultra-thin integrated circuit packages. In particular, the invention relates to reducing the thickness of the layers of the integrated circuit package and mounting thin layers of material to the upper and lower major surfaces of the integrated circuit package to prevent thermal and mechanical warping.

2. Discussion of the Related Technology

Packaging techniques for integrated circuits have been developed in the past in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass-producible packages.

The introduction of highly sophisticated integrated circuit computers and other common bus systems utilizing a variety of integrated circuit elements such as memory devices (DRAMs, VRAMs, FLASH ROMs, E-ROMs, and SRMs), programmable logic arrays (PLAs), microprocessors (CPUs), coprocessors, and other related integrated circuit elements which had to be assembled, mounted and interconnected into as compact, yet reliable packages as feasible to satisfy the industry demands for miniaturization.

Other key considerations in developing packaging for such circuits have been the cost of manufacture, the reliability of the packaged device, heat transfer, moisture penetration, standardization of mounting and interconnect methods and the ability to test and control the quality of the packaged devices.

In the past, one area of concentration for high density packaging has been memory devices such as SRAMs and DRAMs. Prior systems typically utilized a transfer molded plastic encasement surrounding the integrated circuit and having one of a variety of pin-out or mounting and interconnect schemes. The older M-DIPs (Dual-In-Line-Plastic) provides a relatively flat, molded package having dual parallel rows of leads extending from the bottom for through-hole connection and mounted to an underlying circuit board substrate. These packages provided 100 mil spacing between leads.

A more dense package was the 100 mil SIP (Single-In-Line-Plastic), which was assembled on edge with two rows of 100 mil staggered leads extending from the bottom edge for through-hole assembly. Another popular prior art package is the PLCC (Plastic Leaded Chip Carrier), SOJ (Small Outline J-leaded) molded package with twenty surface-mount designed J-leads (length 0.67", width 0.34", height 0.14").

Higher density versions of the SIMM (Single-In-Line Memory Module) design with even smaller versions of the DRAM plastic package have been developed. These thinner versions of SOJ DRAMs are one-half the thickness (having a plastic packaging thickness of about 70 mils) of standard SOJ designs, and have been mounted on both sides of circuit board substrates. Even smaller TSOP (Thin Small Outline Package) packages have been developed experimentally with a plastic thickness of 1 millimeter and lower profile gull-wing leads for surface mounting. Based on experience with these prior art designs, for reasons of reliability related to moisture penetration and mechanical integrity, the industry has adopted a standard thickness for plastic packaging of approximately 1 millimeter (40 mils), or approximately 10.5 mils on each side of an 11 mil thick integrated circuit element attached to a 6 mil thick lead frame.

In an attempt to configure electronic systems in ever smaller packages, new methods and apparatus comprising three-dimensional stacked integrated circuit packages have been developed as more fully described in U.S. Pat. No. 5,279,029, having the common assignee of the present invention and incorporated herein by reference for all purposes. Such multiple package modules pose an even greater need for heat dissipation.

There are integrated circuit packages in commercial production, such as, for example, the TSOP type whose thermal transfer characteristics could be improved upon after manufacture by modifying such packages in accordance with the present invention, thus allowing greater integrated circuit packaging densities and improved reliability.

An example of a fabrication method and apparatus for high density lead-on-packages achieved by laminating one or more lead frames to a standard integrated circuit package is more fully described in co-pending U.S. patent application Ser. No. 07/990,334, filed Dec. 11, 1992, having the common assignee of the present invention and incorporated herein by reference for all purposes. This co-pending U.S. patent application Ser. No. 07/990,334 discloses the use of a stiffener to prevent the warping of a thin integrated circuit package, but this stiffener provides resistance only to mechanical warpage.

In contrast to such prior art technology, the fabrication method of the present invention provides warp-resistant ultra-thin integrated circuit packages that are thermally and mechanically balanced to prevent the ultra-thin profile packages from warping. In addition, the present invention provides a method and apparatus for a warp-resistant, ultra-thin integrated circuit package that is not only thermally and mechanically balanced to prevent the package from warping, but is fabricated so that when multiple packages are stacked vertically to form a three-dimensional package, the packages are electrically insulated from each other to prevent shorting.

SUMMARY OF THE INVENTION

The present invention provides a method for fabricating modified integrated circuit packages from standard integrated circuit packages to provide enhanced thermal conductivity. Achieving improved thermal transfer characteristics from an integrated circuit package results in better heat dissipation and more reliable operation. Using standard commercially-available integrated circuit packages, such as TSOP, allows economical and rapid fabrication of thermally and electrically superior electronic circuits for applications that demand high reliability and performance. Furthermore, the modification provided by the present invention greatly facilitates use of the modified package in a multi-unit, stacked three-dimensional module by providing warp-resistant ultra-thin integrated circuit chip packages so the module will take up less space.

In order to achieve the thinnest package possible, all fabrication layers needed to construct a useful integrated circuit package must be minimized in thickness and number. The present invention discloses an ultra-thin integrated circuit package, which results from reducing the number of layers and the thickness of each layer to a minimum during fabrication of the package elements.

An integrated circuit package contains an integrated circuit die attached to an internal lead frame, which are encapsulated with materials such as transfer-molded plastic. A feature of the present invention is to make the integrated circuit package thinner by lapping or grinding off some of the casing material. A thinner integrated circuit package, however, may warp during fabrication or use due to dissimilar coefficients of thermal expansion in the various layers or component parts which comprise the package. To prevent warping while still maintaining a thin profile, a thin layer of material with a coefficient of thermal expansion that is equal to or less than the coefficient of thermal expansion of silicon is mounted to the upper major surface of the integrated circuit package after the upper major surface has been made thinner by lapping or grinding off some of the casing material uniformly. A suitable material with a coefficient of thermal expansion less than that of silicon that is mounted to the upper major surface of the integrated circuit package may be, for example, Invar. This material can be mounted to the upper major surface of the integrated circuit package with a high temperature epoxy that has a plasticizer that permits expansion without cracking, such as Able Film ™ or Rogers adhesive. The selected epoxy should also have a good shear characteristic at high temperature, and good resistance to moisture penetration. A high temperature thermoplastic adhesive with a plasticizer may be used. Alternatively, a high temperature thermoplastic adhesive without plasticizer, such as AbleLog ™ T1-5501, may be used in less environmentally demanding applications.

The integrated circuit package is made thinner by removing a portion of the lower major surface of the integrated circuit package uniformly to the point where one has achieved the overall thickness desired. The removal of some of the lower major surface of the integrated circuit package will include the casing material and may include some of the integrated circuit die. The lower major surface of the package should not be lapped, however, until the warp-resistant material is mounted to the upper major surface of the package. Otherwise, if the upper surface is lapped without warp-resistant material being added, and then the lower surface is lapped, the package could warp because of the lack of structural rigidity on the upper major surface of the package, which may permanently damage the package.

In an alternative embodiment, a thin layer of material with a coefficient of thermal expansion that is greater than the coefficient of thermal expansion of silicon and preferably approximately equal to that of the casing material is mounted to the lower major surface of the integrated circuit package to prevent warping. The material with a coefficient of thermal expansion that is greater than that of silicon may be, for example, aluminum or copper. This material can be mounted to the lower major surface of the integrated circuit package with a high temperature epoxy similar to that used on the upper surface.

The thickness of the layers of the materials mounted to the upper and lower major surfaces of the integrated circuit package depends on the resulting thermal balance throughout the package to avoid warping of the integrated circuit package. When the integrated circuit package is cooled after it is cured, it tends to warp due to thermal imbalances in the different materials that make up the layers of the integrated circuit package. This tendency to warp increases as the integrated circuit package is made thinner. Unless warpage is controlled, the molded package will bend unacceptably upon cooling from its bonding temperature to cooler storage and operational temperatures. An unacceptable level of warping may be as little as one mil but certainly includes three mils. This level of warping detracts from the integrity of the package and may induce cracking in the die. A potential for package bow results from the method of package construction which utilizes stacked layers of different materials, with each material exhibiting a different coefficient of thermal expansion (CTE). Each material layer, upon cooling, seeks its new dimensions according to its CTE, but is restrained by the presence of the other material layers which make up the assembly. The forces produced by these restraining layers, if not minimized and balanced by proper design, materials selection, and construction, can produce undesirable warpage.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the copper lead frame. The total warpage-causing moments on either side of the neutral thermodynamic axis are the sum of the moments associated with each layer, relative to the neutral thermodynamic axis. For a particular layer, the moment, m, is proportional to the following product:

$$m \approx (E)(h)(t)\Delta(a)\Delta(T)$$

where m is the moment of the layer; E is the Young's modulus of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

A key advantage of the present invention is that one can asymmetrically locate elements formed of different materials in the package and thermally balance them. Thus the integrated circuit die does not have to be symmetrically centered in the package in order to obtain thermal balance throughout the integrated circuit package. Application of the method of the present invention allows one to compensate for material and orientation asymmetries in the integrated circuit package to prevent warping.

An alternative, more refined embodiment confines the upper surface lamination to that area directly overlaying the die within the package. The integrated circuit package is first made thinner by lapping or grinding off some of the casing material uniformly on the upper major surface of the package. Then a material with a coefficient of thermal expansion less than that of silicon is mounted only to the area of the upper major surface of the integrated circuit package that is directly above the integrated circuit die. By mounting this material only directly above the integrated circuit die, greater thermal balance at the perimeter of the package is maintained thereby preventing warping at the edges of the package. Then the lower major surface of the integrated circuit package is made thinner by lapping or grinding off some of the casing material uniformly and possibly some of the integrated circuit die uniformly. A thin layer of material such as one mil of aluminum or copper with a coefficient of thermal expansion that is approximately that of the casing material used to encapsulate the die which is always significantly greater than the coefficient of thermal expansion of silicon is mounted to the lower major surface of the integrated circuit package to prevent warping. This material is mounted only to the area of the lower major surface of the package that is directly below the integrated circuit die.

Yet another alternative embodiment of the present invention is to confine the lamination of the upper surface after grinding or lapping only that area directly above the integrated circuit die and the extensions that run perpendicular to the leads of the integrated circuit package. Then the lower major surface of the package is lapped or ground off uniformly and a material with a coefficient of thermal expansion approximately equal to the molding material and greater than that of silicon is mounted to the lower major surface of the integrated circuit package. This material mounted to the lower major surface of the package is mounted directly under the area covered by the material mounted to the upper major surface of the package.

In another embodiment, after lapping, warp resistant material is applied to the upper major surface of the package extending only directly above the integrated circuit die. Then polyimide strips are mounted to the upper major surface of the package along the extensions of the package that run perpendicular to the leads. The lower major surface of the package is lapped off uniformly and suitable warp resistant material as in the other embodiments is mounted to the lower major surface of the package to that area directly below the integrated circuit die. Polyimide strips are then mounted to the lower major surface of the package directly under the area where the polyimide strips are mounted to the upper major surface of the package.

In another embodiment, a warp-resistant ultra-thin integrated circuit package is achieved by lapping off uniformly some of the casing material across the upper major surface of an integrated circuit package until the casing material across that surface is about 6.0 mils thick. Then about a one mil thick layer of Invar is mounted to the upper major surface of the integrated circuit package with about a 0.4 mil thick layer of high temperature epoxy containing a plasticizer which permits expansion without cracking, such as Able Film TM. A high temperature thermoplastic adhesive, with or without a plasticizer, may also be used. The integrated circuit package is further made thinner by lapping off all of the casing material uniformly and some of the integrated circuit die uniformly across the lower major surface of the integrated circuit package until the integrated circuit die is about 5.4 mils thick. Then about a 1.0 mil thick layer of aluminum or copper is mounted to the lower major surface of the integrated circuit package with about a 0.4 mil thick layer of high temperature epoxy containing a plasticizer. Then the integrated circuit package is cured at a temperature of about 175° C. for about two hours at a pressure of about 16 psi.

In a still further preferred embodiment, after the integrated circuit package is made thinner by lapping off casing material on the lower major surface of the package, material, such a aluminum or copper, which has a coefficient of thermal expansion greater than that of silicon and preferably approximately equal to that of the casing material is prepared prior to being mounted on the lower surface of the package. A coat of adhesive is applied to the upper and lower major surface of the material and the adhesive is then cured. After curing, a second coat of adhesive is applied to both sides of the material, above the layer of cured adhesive, and the material is then laminated to the bottom major surface of the integrated circuit package. After lamination, the package is heated to cure a second layer of adhesive on the package. This method will ensure electrical insulation between the material on the lower surface of the package and the integrated circuit die within the package, and between individual packages when the packages are vertically stacked to form a three-dimensional level-two high density integrated circuit package.

DETAILED DESCRIPTION OF THE PREFERRED EMBODIMENT

Figure 1:
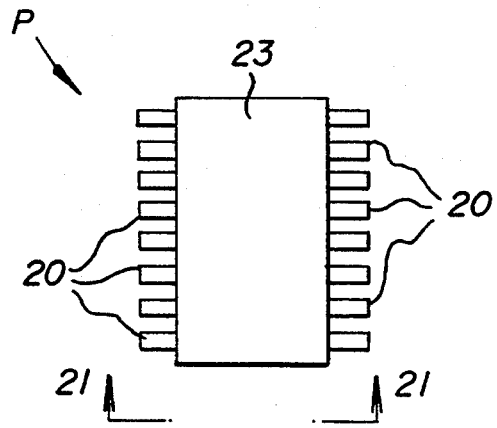
FIG. 1 is a schematic plan view of a standard integrated circuit package.
Figure 2:
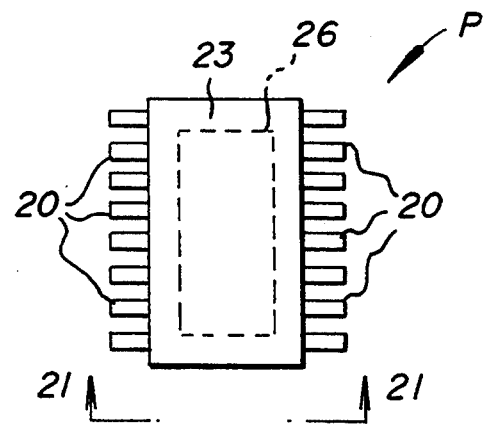
FIG. 2 is a schematic plan view of a standard integrated circuit package illustrating the position of the integrated circuit die.
Figure 3:
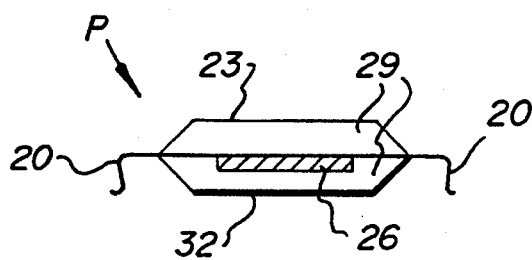
FIG. 3 is a schematic cross-sectional view of FIGS. 1 or 2 taken along section line 21—21.

A better understanding of the present invention can be had when the following detailed description is read with reference to the drawings wherein common elements are designated with like numbers or letters. Referring now to FIGS. 1, 2 and 3, a standard integrated circuit package P is illustrated in schematic plan view and schematic cross-sectional view. The standard integrated circuit package P comprises an integrated circuit die 26 that is surrounded by casing material 29, which is provided with an array of leads 20 for circuit interconnections. A standard integrated circuit package P includes a silicon integrated circuit die 26 having a nominal thickness of from about eight to about sixteen mils. It should be noted that in the drawings, the conductive leads 20 are illustrated as being connected at or near the edge of the integrated circuit die 26 for clarity. It should also be noted that the present invention is not limited to embodiments having leads exiting at two sides and can be readily fabricated to accommodate single or four-sided lead configurations, in either J-lead, gull-wing or other surface mount technology (SMT) lead configurations.

Figure 4:
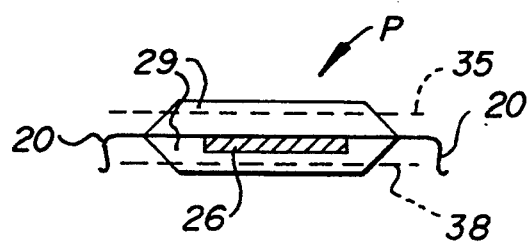
FIG. 4 is a schematic cross-sectional view of FIGS. 1 or 2 taken along section line 21—21 illustrating the removal of some casing material from the upper and lower major surfaces of the integrated circuit package.
Figure 5:
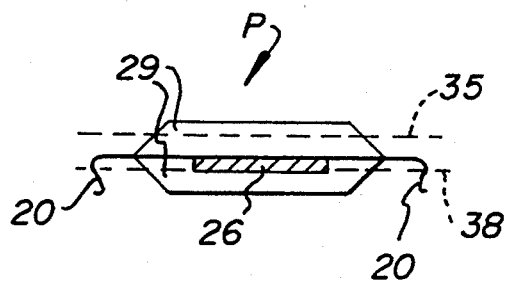
FIG. 5 is a schematic cross-sectional view of FIGS. 1 or 2 taken along section line 21—21 illustrating the removal of some casing material and removal of some of the integrated circuit die.
Figure 5A:
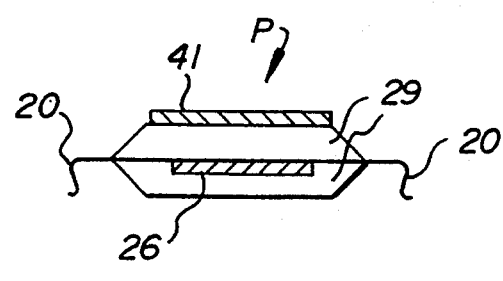
FIG. 5A is a schematic cross-sectional view of an embodiment of the present invention illustrating the mounting of the material to the upper major surface of the integrated circuit package.
Figure 7:
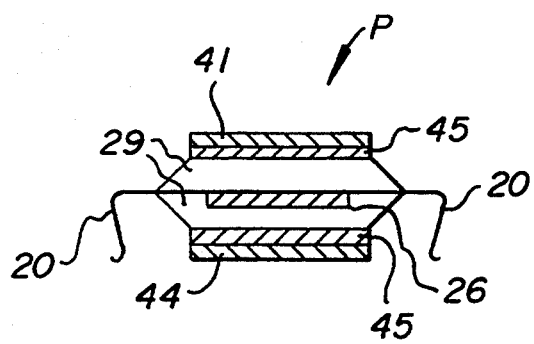
FIG. 7 is a schematic cross-sectional view of an embodiment of the present invention illustrating the mounting of the materials to the upper and lower major surfaces of the integrated circuit package with a thin layer of high temperature adhesive containing a plasticizer which permits expansion without cracking.

Since the principle objective of this invention is to achieve thin, yet durable and reliable circuit packaging, it is important that the molded casing be made as thin as possible without breaking, warping or destroying the integrity of the integrated circuit package P. Referring now to FIGS. 4 and 5, a schematic cross-sectional view of FIG. 1 or 2 taken along section line 21—21 illustrates the reduction in overall thickness of the integrated circuit package P by removing some casing material 29 uniformly across the upper major surface 23 and the lower major surface 32 of the integrated circuit package P. As shown in FIGS. 4 and 5, the casing material 29 is removed uniformly across the upper major surface 23 of the integrated circuit package P to the point 35 where one has achieved the overall thickness desired. Some of the casing material 29 from surface 23 of the integrated circuit package P is removed by lapping or grinding. However, a thinner integrated circuit package P may warp during fabrication or use due to dissimilar coefficients of thermal expansion in the various layers or component parts which comprise the package P. As illustrated in FIG. 5A, to prevent warping while still maintaining a thin profile, a thin layer of material 41 with a coefficient of thermal expansion less than that of silicon is mounted to surface 23 of the integrated circuit package P after the package P has been thinned somewhat by lapping. Material 41 may be, for example, Invar. As shown in FIG. 7, one possible method of mounting material 41 is by using a high temperature adhesive 45, such as an epoxy containing a plasticizer that permits expansion without cracking. An example of a suitable adhesive 45 is Able Film TM. The selected adhesive should also have a good shear characteristic at high temperature, and good resistance to moisture penetration. Alternatively, a high temperature thermoplastic adhesive with a plasticizer may be used, or a high temperature thermoplastic adhesive without a plasticizer such as AbleLog TM T1-5501 may be used in less environmentally demanding embodiments.

Next, the thickness of the integrated circuit package P is further reduced by removing some of the casing material 29 uniformly across the lower major surface 32 of the integrated circuit package P. As shown in FIGS. 4 and 5, the casing material 29 is removed uniformly across surface 32 of the integrated circuit package P to the point 38 where one has achieved the overall thickness desired.

Figure 6:
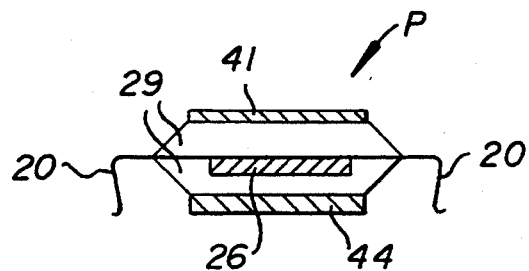
FIG. 6 is a schematic cross-sectional view of an embodiment of the present invention illustrating the mounting of the materials to the upper and lower major surfaces of the integrated circuit package.

In an alternative embodiment, as illustrated in FIG. 6, after some of the casing material 29 is removed from surface 32, a thin layer of material 44 with a coefficient of thermal expansion greater than that of silicon and preferably approximately equal to that of the casing material 29 is mounted to surface 32 of the integrated circuit package P to prevent warping. An example of a suitable material 44 is aluminum or copper. As shown in FIG. 7, material 44 can be mounted using a high temperature adhesive 45 similar to that used on the upper major surface 23. Suitable mounting adhesive 45 may be an epoxy, such as Able Film TM, or a high temperature thermoplastic adhesive with or without a plasticizer. Preferably, at least a one mil layer of high temperature thermoplastic with a plasticizer having a reflow temperature of about 230 degrees Celsius is used. It should be noted that increased pressure on the thermoplastic layer decreases its melting point.

Figure 8:
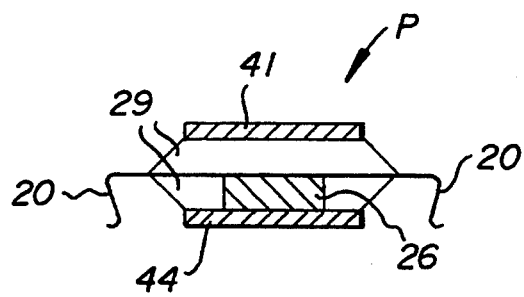
FIG. 8 is a schematic cross-sectional view of an embodiment of the present invention illustrating the removal of the casing material and some of the integrated circuit die from the lower major surface of the package and the mounting of the materials to the upper and lower major surfaces of the integrated circuit package.

FIG. 8 illustrates a preferred embodiment wherein some of the casing material 29 has been removed uniformly from surface 23 of the integrated circuit package P and a thin layer of material 41 with a coefficient of thermal expansion less than that of silicon is mounted to surface 23 of the package P. The casing material 29 on surface 32 of the package P is removed uniformly and some of the lower surface of the integrated circuit die 26 is removed uniformly from surface 32 of the package P. Then a thin layer of material 44 with a coefficient of thermal expansion greater than that of silicon and preferably approximately equal to that of the casing material 29 is mounted to surface 32 of the integrated circuit package P to prevent warping.

Figure 9:
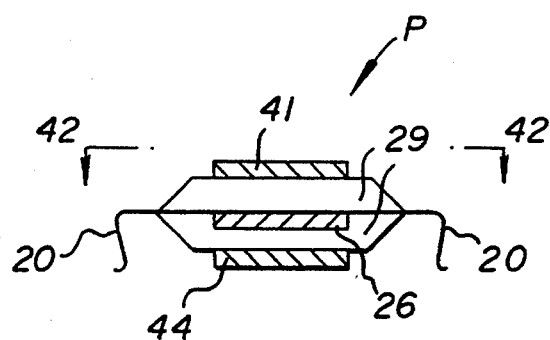
FIG. 9 is a schematic cross-sectional view of an embodiment of the present invention illustrating the mounting of the materials to the upper and lower major surfaces of the integrated circuit package only directly above and below the integrated circuit die.
Figure 10:
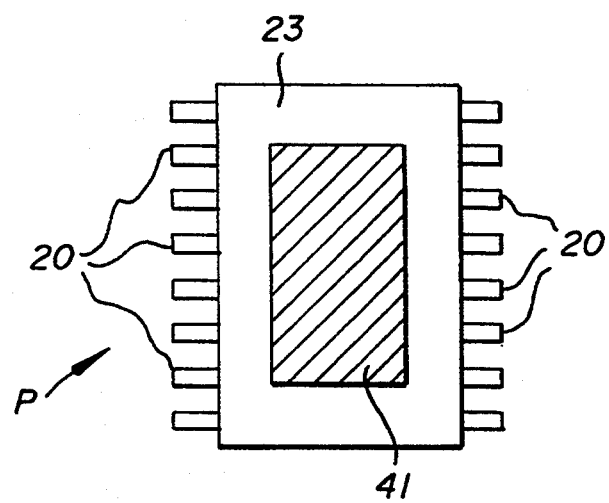
FIG. 10 is a schematic plan view of FIG. 9 taken along section line 42—42.

FIGS. 9 and 10 illustrate another preferred embodiment wherein some of the casing material 29 has been removed uniformly from surface 23 of the integrated circuit package P and a thin layer of material 41 with a coefficient of thermal expansion less than that of silicon is mounted only to the area of surface 23 that is directly above the integrated circuit die 26. By mounting this material 41 only directly above the integrated circuit die 26, greater thermal balance at the perimeter of the package P is maintained thereby preventing warping at the edges of the package. Next, some of the casing material 29 on surface 32 is removed uniformly across surface 32 of the integrated circuit package P. A thin layer of material 44, such as one mil of aluminum or copper, with a coefficient of thermal expansion greater than that of silicon is mounted only to the area of surface 32 that is directly below the integrated circuit die 26 to prevent warping.

Figure 11:
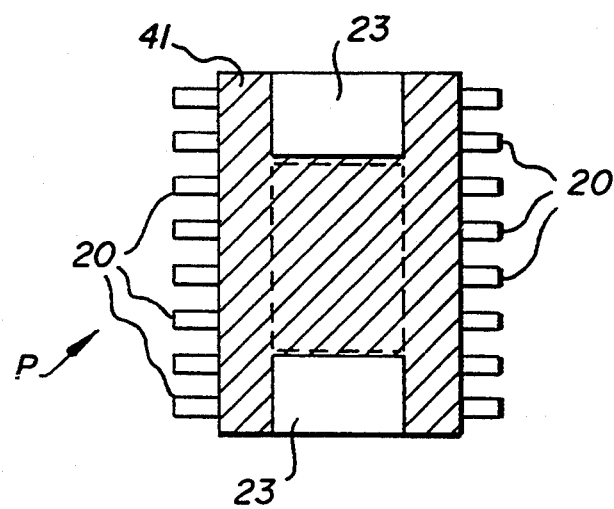
FIG. 11 is a schematic plan view of an embodiment of the present invention illustrating the mounting of materials to certain areas of the upper and lower major surfaces of the integrated circuit package.

FIG. 11 illustrates another preferred embodiment wherein some of the casing material 29 has been removed uniformly across surface 23 of the integrated circuit package P. Then a suitable warp-resistant material 41 as in the other embodiments is mounted only to the area of surface 23 that is directly above the integrated circuit die 26 and over the extensions that run perpendicular to the leads 20 of the package P. By mounting this material 41 only directly above the integrated circuit die 26 and over the extensions that run perpendicular to the leads 20 of the integrated circuit package P, solder balls are prevented from forming along the edge of the mounted material 41 while still maintaining thermal balance at the perimeter of the package P. Solder balls can result in electrical shorts between the leads 20 or between stacked integrated circuit packages P. Solder balls also make the surface 23 rough thus making the package P less aesthetically pleasing as well as making it more difficult to stack integrated circuit packages P.

Thereafter, the package P is further thinned by removing some of the casing material 29 uniformly across surface 32 of the package P. A suitable warp-resistant material 44 as in the other embodiments is mounted only to the area of surface 32 that is directly below the integrated circuit die 26 and directly below the material 41 mounted to surface 23 of the package P. This prevents the formation of solder balls along the edges of the material 44 mounted to surface 32 and prevents warping by retaining a thermal balance throughout the integrated circuit package P.

Figure 12:
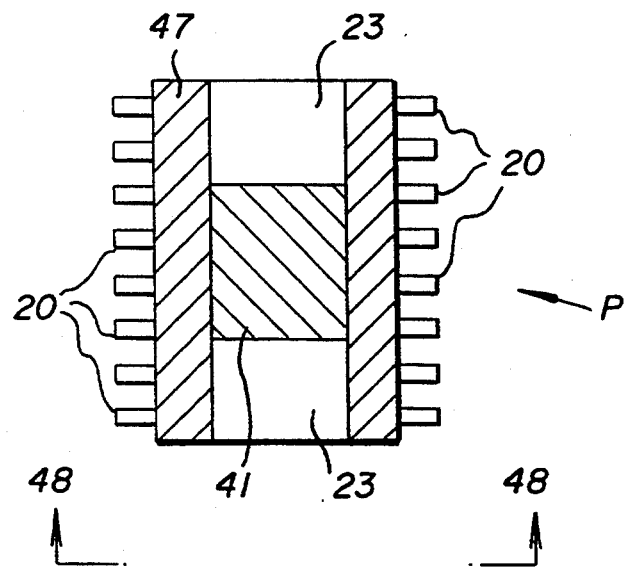
FIG. 12 is a schematic plan view of an embodiment of the present invention illustrating the mounting of material to the upper and lower major surfaces of the integrated circuit package directly above and below the integrated circuit die and the mounting of polyimide strips to the upper and lower major surfaces of the integrated circuit package.
Figure 13:
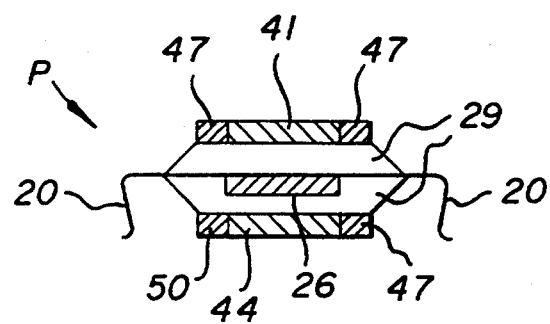
FIG. 13 is a schematic cross-sectional view of FIG. 12 taken along section line 48—48.

FIGS. 12 and 13 illustrate another preferred embodiment wherein some of the casing material 29 has been removed uniformly across surface 23 of the integrated circuit package P. Then a thin layer of material 41 with a coefficient of thermal expansion less than that of silicon is mounted only to the area of surface 23 that is directly above the integrated circuit die 26. Then thin strips 47 of material such as polyimide are mounted to surface 23 of the package P along the extensions of the package P that run perpendicular to the leads 20 of the package P. Mounting the material 41 only directly above the integrated circuit die 26 and the strips 47 of material prevents the formation of solder balls along the edge of the mounted material 41, while still maintaining thermal balance at the perimeter of the package P. Solder balls can result in electrical shorts between the leads 20 or between stacked integrated circuit packages P. Solder balls also make the surface 23 rough thus making the package P less aesthetically pleasing as well as making it more difficult to stack integrated circuit packages P.

Next, the package P is further thinned by removing some of the casing material 29 uniformly across surface 32 of the integrated circuit package P. A thin layer of material 44 with a coefficient of thermal expansion greater than that of silicon is mounted only to the area of surface 23 that is directly below the integrated circuit die 26. Thin strips 47 of material, such as polyimide, are then mounted to surface 32 along the extensions of the package P that run perpendicular to the leads 20 and directly below the thin strips 47 mounted to surface 23 of the package P. This prevents the formation of solder balls along the edges of the material 44 mounted to surface 32 and prevents warping by retaining a thermal balance throughout the integrated circuit package P.

Figure 14:
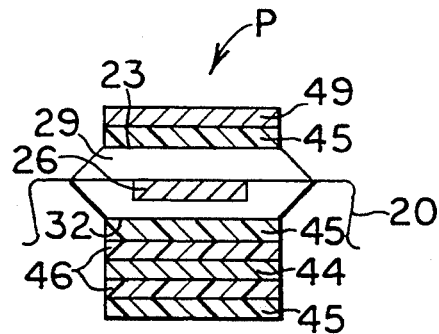
FIG. 14 is a schematic cross-sectional view of an embodiment of the present invention illustrating the materials to be mounted to the top and lower major surface of the integrated circuit package and the layers of adhesive surrounding the warp resistant material mounted to the lower major surface of the level-one package.

In any of the above embodiments where warp-resistant material is mounted to the lower major surface of the integrated circuit package P, a further preferred method may be used to fabricate a warp-resistant integrated circuit package of the present invention. One embodiment of the integrated circuit package P resulting from this method is illustrated in FIG. 14. It should be noted, however, that this method may also be used to fabricate the integrated circuit packages illustrated in FIGS. 6, 7, 8 and 9. Package P may be fabricated by first lapping the casing material 29 on the top major surface 23 of package P to achieve a thinner profile. Although not preferred, the lapping may also be accomplished by grinding, cutting, shaving, or other method to achieve a thinner package profile. After lapping, the package P is then cleaned of all lappings and other debris. Package P is then heated to approximately 175° C. to 230° C. for approximately 20 minutes.

A thin layer of Invar is then prepared prior to being mounted to the top major surface 23 of package P. A thin sheet of Invar, approximately 2 mils thick, is etched on one, or both, major surfaces to achieve a thin film of Invar approximately 1.2 to 1.3 mils thick. The etching is necessary to provide surface roughness to the thin film of Invar to improve bonding with the upper surface 23 of package P. The thin film of Invar 49 is then laminated to the top major surface 23 of package P with an appropriate high temperature adhesive 45, such as "AbleStick" brand epoxy, or Rogers adhesive made by Rogers Corp. of Chandler, Ariz. Alternately, adhesive 45 can be a high temperature thermoplastic with or without a plasticizer.

Package P, with a thin film of Invar 49 laminated to the top major surface 23, is then heated to approximately 175°–230° C. for approximately 20 minutes to cure adhesive layer 45. During this curing process, pressure should be applied to the Invar film 49 by a clamp, a stack of weights, or other method suitable to apply pressure uniformly (not shown) over the thin film of Invar 49 to press it down securely and uniformly against the top major surface 23 of package P. The force applied should be sufficient to improve the bonding without damaging package P or integrated circuit die 26 contained therein.

After curing and cooling, the casing material 29 on the bottom major surface 32 of package P is lapped using the same techniques as explained above for the top surface 23 of package P and is then cleaned of all debris. Some or all of the casing material 29 may be removed from the lower major surface 32, including a portion of the integrated circuit die 26. Package P is then heated to approximately 175°–230° C. for approximately 20 minutes.

Material 44 with a coefficient of thermal expansion greater than that of silicon and preferably approximately equal to that of the casing material 29, preferably a thin sheet of copper or aluminum, is then prepared to be mounted to the lower major surface 32 of package P. The material 44, which is preferably copper, is approximately 1 mil thick. A first thin adhesive layer 46 of AbleStick or Rogers adhesive (approximately 0.3 to 0.4 mils thick), or a high temperature thermoplastic (one mil thick or less), is applied to both major surfaces of material 44. Material 44, with first adhesive layers 46, is then heated to approximately 175° C. to cure adhesive layers 46. The curing will take approximately two hours if AbleStick adhesive is used and approximately 30 minutes if Rogers adhesive is used. Preferably, a high temperature thermoplastic with a reflow temperature of about 230° C. can be used.

A second thin adhesive layer 45, which can be a high temperature epoxy or thermoplastic, as discussed above, is then applied to both major surfaces of material 44 on top of the first cured adhesive layers 46 previously applied. It is preferable to apply the same type of adhesive over each of the cured layers of adhesive as that which was originally applied to the material. Without yet curing the second adhesive layers 45, material 44, including the first and second adhesive layers, 46 and 45, respectively, is then laminated to the bottom major surface 32 of package P. After lamination, the entire package P is then heated to 175° C. for approximately two hours to cure the second adhesive layers 45.

Using this method, having at least one cured layer of adhesive on each major surface of the lower warp-resistant material 44 (copper or aluminum), an electrical insulation layer is provided between the material 44 and the lower surface 32 of level-one package P, and between the lower surface 32 of package P and the upper major surface of another level-one package (not shown) if individual packages are vertically stacked to form a three-dimensional level-two integrated circuit package. The stacking of level-one packages in the preferred embodiment results in laminates of different metals, e.g. Invar and copper, being adjacent one another and separated by only the thickness of the adhesive layers.

The two-stage adhesive bonding of the present invention provides improved resistance to corrosion and other deleterious effects which might otherwise result from current leakage from one package to another and from the Invar or copper layer on each level-one package P to the integrated circuit die or electrical conductors within the package.

Figure 15:
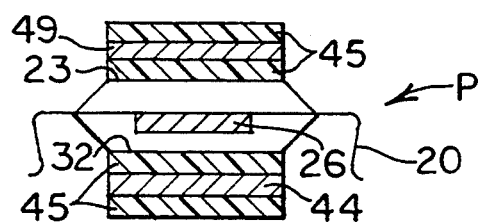
FIG. 15 is a schematic cross-sectional view of an embodiment of the present invention showing an adhesive layer of high temperature thermoplastic on either side of the warp resistant material mounted to the top and bottom of the level-one package.

As shown in FIG. 15, in another embodiment, a single layer of a high temperature thermoplastic material can be used as adhesive 45, which can then be applied between the top major surface 23 of package P and material 49, and between the lower major surface 32 of package P and material 44. Additionally, the adhesive 45 thermoplastic material can be applied to the remaining major surface on the opposite side of package P.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the copper lead frame. The total warpage-causing moments on either side of the neutral thermodynamic axis are the sum of the moments associated with each layer, relative to the neutral thermodynamic axis. For a particular layer, the moment, m, is proportional to the following product:

$$m \approx (E)(h)(t)\Delta(a)\Delta(T)$$

where m is the moment of the layer; E is the Young's modulus of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

A key advantage of the present invention is that one can asymmetrically locate elements formed of different materials in the package P and thermally balance them. Thus the integrated circuit die 14 does not have to be symmetrically centered in the package P in order to obtain thermal balance throughout the integrated circuit package P. Application of the method of the present invention allows one to compensate for material and orientation asymmetries in the integrated circuit package P to prevent warping.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of manufacturing a warp-resistant integrated circuit package of the type that includes a molded casing containing an integrated circuit die formed on a silicon substrate comprising the steps of:

providing an integrated circuit package having upper and lower major surfaces;

reducing the overall thickness of said integrated circuit package by removing some casing material uniformly across said upper major surface;

mounting a first thin layer of material with a coefficient of thermal expansion less than or equal to the coefficient of thermal expansion of silicon with at least one layer of high temperature adhesive to said upper major surface of said integrated circuit package;

reducing the overall thickness of said integrated circuit package by removing some casing material uniformly across said lower major surface;

applying a first layer of high temperature adhesive to the upper and lower major surfaces of a second thin layer of material having a coefficient of thermal expansion greater than the coefficient of thermal expansion of silicon;

curing said first layer of adhesive;

applying a second layer of high temperature adhesive over said cured first layer of adhesive; and mounting said second thin layer of material to said lower major surface of said integrated circuit package.

2. The method of claim 1, further comprising the step of removing all of said casing and some of said integrated circuit die uniformly from said lower major surface of said package so that said die is about 5.4 mils thick.

3. The method of claim 1, wherein said second thin layer of material mounted to said lower major surface has a coefficient of thermal expansion approximately equal to that of said casing material.

4. The method of claim 1, wherein said step of mounting said thin layers of materials is accomplished by adhering with high temperature adhesive that permits expansion without cracking.

5. The method of claim 1, wherein said first thin layer of material having a coefficient of thermal expansion less than the coefficient of thermal expansion of silicon comprises Invar.

6. The method of claim 1, wherein said second thin layer of material having a coefficient of thermal expansion greater than the coefficient of thermal expansion of silicon comprises aluminum.

7. The method of claim 1, wherein said second thin layer of material having a coefficient of thermal expansion greater than the coefficient of thermal expansion of silicon comprises copper.

8. The method of claim 1, wherein the thickness of said casing material of said upper major surface is reduced to 6.0 mil and the thickness of said die is reduced to 5.4 mil.

9. The method of claim 1, wherein said thin layers of material mounted to said upper and lower major surfaces are mounted only directly above and below said silicon die of said integrated circuit package, respectively.

10. The method of claim 1, further comprising the step of curing said second layer of adhesive after said layer is applied over said first layer of adhesive and said second thin layer of material has been mounted to said lower major surface of said package.

11. The method of claim 5, wherein prior to mounting said first thin layer of material to said upper major surface of said package, the following steps are performed:

(a) obtaining a thin sheet of Invar about 2 mils thick; and (b) etching at least one major surface of said Invar sheet so that a thin film of Invar is formed between about 1.2 to 1.3 mils thick.

12. A method of manufacturing a warp-resistant integrated circuit package of the type that includes plastic casing material comprising the steps of:

providing an integrated circuit package having upper and lower major surfaces;

reducing the overall thickness of said integrated circuit package by removing some casing material uniformly across said upper major surface until said casing material across said upper major surface is about 6.0 mils thick;

etching at least one major surface of a thin sheet of Invar until it forms a thin film between about 1.3 to 1.2 mils thick;

mounting said thin film of Invar to said upper major surface of said integrated circuit package with high temperature adhesive;

reducing the overall thickness of said integrated circuit package by removing at least a portion of said casing material uniformly from said lower major surface of said integrated circuit package;

applying a first layer of high temperature adhesive to at least one major surface of a thin layer of material having a coefficient of thermal expansion greater than the coefficient of thermal expansion of silicon and approximately equal to the coefficient of thermal expansion of said casing;

curing said first layer of adhesive by heating said material and first adhesive layer to between about 175 and 230 degrees Celsius;

applying a second layer of high temperature adhesive over said cured first layer of adhesive;

mounting said thin layer of material including said first and second layers of adhesive to said lower major surface of said integrated circuit package; and curing said second layer of adhesive.

13. The method of claim 12, wherein said first adhesive layer is between about 0.3 and 0.4 mils thick.

14. The method of claim 12, wherein said thin layer of material mounted to said lower major surface comprises copper.

15. The method of claim 12, further comprising the step of curing said high temperature adhesive layer after said thin film of Invar is mounted to said upper major surface by heating to between about 175 and 230 degrees Celsius for about 20 minutes.

16. A method of manufacturing a warp-resistant integrated circuit package of the type that includes plastic casing material comprising the steps of:

providing an integrated circuit package having upper and lower major surfaces;

reducing the overall thickness of said integrated circuit package by removing some casing material uniformly across said upper major surface until said casing material across said upper major surface is about 6.0 mils thick;

mounting a thin film of Invar to said upper major surface of said integrated circuit package with a layer of high temperature thermoplastic adhesive;

reducing the overall thickness of said integrated circuit package by removing at least a portion of said casing material uniformly from said lower major surface of said integrated circuit package;

applying a layer of high temperature thermoplastic adhesive between said integrated circuit package and a major surface of a thin layer of material having a coefficient of thermal expansion greater than the coefficient of thermal expansion of silicon and approximately equal to the coefficient of thermal expansion of said casing, whereby said material is mounted to said package; and curing said thermoplastic adhesive by heating said package to about 230 degrees Celsius.

17. The method of claim 16, further comprising the step of:

applying a layer of high temperature thermoplastic adhesive to the outside major surface of said thin film of Invar.

18. The method of claim 16, further comprising the step of:

applying a layer of high temperature thermoplastic adhesive to the outside major surface of said thin layer of material having a coefficient of thermal expansion greater than the coefficient of thermal expansion of silicon and approximately equal to the coefficient of thermal expansion of said casing.

* * * * *

UNITED STATES PATENT AND TRADEMARK OFFICE
CERTIFICATE OF CORRECTION

PATENT NO.   : 5,369,058
DATED        : November 29, 1994
INVENTOR(S)  : Burns, et al It is certified that error appears in the above-indentified patent and that said Letters Patent is hereby corrected as shown below:

On the title page, item [21], should read -- 206,301 --.

Signed and Sealed this

Twelfth Day of October, 1999

Attest:

Q. TODD DICKINSON

Attesting Officer

Acting Commissioner of Patents and Trademarks